United States Patent [19]

Jacobi

[11] Patent Number: 4,842,662
[45] Date of Patent: Jun. 27, 1989

[54] PROCESS FOR BONDING INTEGRATED CIRCUIT COMPONENTS

[75] Inventor: John W. Jacobi, Fort Collins, Colo.

[73] Assignee: Hewlett-Packard Company, Palo Alto, Calif.

[21] Appl. No.: 201,494

[22] Filed: Jun. 1, 1988

[51] Int. Cl.⁴ .................... H01L 21/58; H01L 21/60; B23K 1/06; B32B 31/16
[52] U.S. Cl. .................... 156/633; 156/73.1; 156/655; 156/901; 228/110; 437/209
[58] Field of Search .............. 156/73.1, 73.6, 629, 156/633, 655, 668, 901, 902; 228/110, 179; 357/69; 29/827, 839, 879; 437/182, 183, 209

[56] References Cited

U.S. PATENT DOCUMENTS 4,189,825  2/1980  Robillard et al. ............. 437/209 X
4,676,864  6/1987  Maeda et al. ................... 156/633

OTHER PUBLICATIONS

ISHM'87 Proceedings, Single Point Tab (SPT), a Versatile Tool for Tab Bonding, Gary Silverberg.

Primary Examiner—William A. Powell
Attorney, Agent, or Firm—William W. Cochran

[57] ABSTRACT

Tape-automated-bonding (TAB) tape can be directly bonded (i.e., no "gold bumps" are needed) to aluminum bonding pads of integrated circuit devices, without contacting any other part of the integrated circuit device, by use of a process employing the herein disclosed parameters of ultrasonic energy, pressure, time, heat, and relative dimensions of the TAB tape.

12 Claims, 3 Drawing Sheets

PROCESS FOR BONDING INTEGRATED CIRCUIT COMPONENTS

BACKGROUND OF THE INVENTION

Field of the Invention.

This invention generally relates to methods of bonding integrated circuit terminal pads to integrated circuit package leads. More specifically this invention especially relates to single point bond processes adapted for use in conjunction with tape-automated-bonding (TAB) tape.

2. Description of the Prior Art

Many factors contribute to the overall cost of manufacturing integrated circuits. For example, the cost of the purified silicon material used in each circuit element is an important factor. However, other important cost considerations revolve around the fact that all such integrated circuit elements, once produced, must be interconnected with each other, as well as with other circuit components, into an assembled package. One must also consider the costs associated with the rate of failure in performing a succession of steps that reduce, at each stage of the process, the number of survivors of that process. This is particularly true in the context of manufacturing integrated circuits because most of the basic methods of manufacture often involve a succession of operations which are each characterized by certain attendant yield losses. For example, attritional losses occur at each oxide-removal and diffusion step of the manufacturing process. This is due to a variety of causes, e.g., imperfections in the original silicon, incomplete cleaning of slices, uneven photoresist application and removal, the presence of dust particles and/or other unwanted impurities in diffused areas, incomplete control over the etching process and mechanical breakage of the integrated circuit devices. Although the loss in each such operation may be small, e.g., 1 or 2 percent, there usually are so many sequential operations that the yield up to the end of the manufacturing process i.e., scribing the slice into chips and then sorting them, can be rather low. Ultimate yields of between 10 and 40%, depending on the circuit, are not at all uncommon.

Furthermore, after their manufacture, integrated circuit elements also may be damaged during assembly operations and there may well be further losses at the point of final test due to units not meeting specifications. Thus, the ultimate yield can be as low as say 5% to 20%, again depending on the type of integrated circuit being manufactured. Such yields would be considered unacceptably low when compared to yields in discrete component electronic assemblies. However, since, on only one slice, up to 500 circuits may be fabricated simultaneously, the overall economics are such that the final costs still may well be substantially lower than a corresponding discrete component assembly.

Moreover, after the integrated circuits are completely manufactured there remains the necessity of proper emplacement and secure interconnection of all such integrated circuit elements by means of conduits of some kind of highly conductive material. Such interconnections are fundamental to all integrated circuit manufacturing operations. The question of compatibility of materials also arises in making such interconnections. That is to say different and incompatible materials sometimes have to be made compatible with each other. For example, a copper conductor wire is not necessarily compatible with an aluminum pad, but each material may have been selected for its own virtues, in the context of other circuit function considerations, and hence the two elements may have to be electrically and mechanically associated with each other at some point in the integrated circuit device. Thus, in providing methods for making such connections, an interface material sometimes must be introduced to produce a mutual compatibility of each two or more otherwise incompatible elements. In the integrated circuit arts, gold and tin are often used for this purpose in conjunction with various thermal ultrasonic and/or compression bonding processes.

For example, one of the earliest practical applications of thermal compression bonding in the integrated circuit arena was the so-called "ball bonding" process. With it, a gold wire, about 1 mil in diameter, is fed through a capillary needle and a minute hydrogen gas flame is passed across the wire as it emerges from the capillary tip. The flame melts the end of the wire and forms a tiny globule of molten gold. An electrical assembly is then heated together with a pad to which the bond is to be made. The capillary is then lowered so the ball on the end of the wire contacts the thermal pad on the chip. The lowering process can be made to proceed in such a manner that the capillary tip actually pushes and flattens the gold ball. This combination of pressure and temperature results in the desired bond between the gold and say an aluminum or aluminum alloy bonding pad. The capillary can then be raised on the fixed gold wire and removed horizontally to a terminal where the wire can be welded. The capillary is then raised and the wire cut by the hydrogen flame. This action forms a new gold ball; hence, the operation is ready to be repeated. This method, although effective, is slow and cumbersome. Hence, alternative methods were developed to circumvent these problems. Most of the alternative methods usually involve the placement of a gold globule, usually referred to as a "bump", in advance of the lead/chip connection process. Such gold bumps have been placed both on the terminal pad of the chip and on the underside of the lead or copper wire to be connected to the chip.

In order to fully appreciate some of the advantages of the direct bonding process of this patent disclosure, it is first necessary to have some appreciation for the complexities of these alternative methods, especially those involved in fashioning gold bumps on chips. Generally these methods are referred to as "old bump bonding" or "gold bump thermal compression bonding". They have heretofore proven to be one of the most feasible means of precision localization, registration, connection and segregation of wire lead/pad bonds. The complexities of this bonding technique are best understood by examining the sequence of the major steps taken in this bonding technology since an understanding of them will serve to demonstrate the improvements in productivity, quality, precision and reliability of the process produced by this patent disclosure.

To this end, FIGS. 1 to 3 show a typical prior art method for forming gold bumps. Here, an integrated circuit chip 10 is shown as being comprised of a platinum film 16 formed over a titanium film 14 which in turn is formed on an insulating substrate 12. As is shown in FIG. 1, an organic photoresist 18 is then applied over the platinum film 16. FIG. 2 indicates how the organic photoresist 18 is then patterned by using a photo mask so as to make a dummy wafer having openings 22 for forming gold bumps. Then, as shown in FIG. 3, bumps 20 of gold are formed by plating by using the titanium film 14 and the platinum film 16 as the plating electrode. The organic photoresist 18 is then removed by using an organic solvent so as to prevent softening or transformation of the organic photoresist 18 and to prevent adhering of the organic photoresist 18 to the gold bumps 20 or to the tool for thermo-compression bonding. This preventive step is important since such adherence would have a bad influence upon bonding the gold bumps to the bonding pads of the semiconductor element. As is indicated in FIG. 4, the organic photoresist then must be again applied, patterned and removed in order to again form the gold bumps 20. In this prior art method, the removing step must take place before the first bonding, because the organic photoresist 18 is used as a mask for the plating. Furthermore, this necessitates repetition of the above-mentioned steps after the application step of the organic photoresist 18. Therefore, this prior art method is expensive both in the material cost of the organic photoresist 18 and in the time and equipment needed to carry out such complex operations.

Obviously such a degree of complexity in fabricating gold bumps has produced numerous attempts to make improvements in the technique. For example, U.S. Pat. No. 4,676,864 teaches a bonding method characterized by its not having a removal step of the photo-resist as a mask for the plating operation. Generally the process involves: (1) forming a photoresist film having a predetermined pattern on a conductive layer formed on a dummy wafer, (2) depositing a heat-resistent insulating layer all over the surface of said dummy wafer, (3) removing said photoresist film together with said heat-resistive insulating layer deposited thereon, thereby forming openings, (4) forming gold bumps on said openings by plating using said heat-resisting insulating layer as a mask and using said conductive layer as a plating electrode, (5) transferring said bumps to inner leads from said dummy wafer, and (6) thermo-compression bonding the said bumps of the inner leads to bonding pads of the semiconductor element. Obviously this method is not without its own complexities.

Furthermore, all such gold bump bonding techniques have certain spatial and mechanical drawbacks. Many of these follow from the fact that such gold "bumps" often have a nearly half-round or three-quarter round top contour. This makes for mating problems because they are generally connected to round or flat, ribbon-like tapes. Thus for example when an essentially flat ribbon-like tape is forced down on to an essentially ball like globule of gold, the tape is sometimes apt to slide off the top of the ball and be skewed or otherwise tilted off to one side or the other. Such skew or tilt can, in turn, cause the tape to touch parts of the I.C. chip other than the pad. The tape can for example come into contact with other parts of the I.C. chip and/or in contact with adjacent leads.

Moreover since such gold bumps must be kept as small as possible for obvious economic reasons, they typically are less than about 0.5 thousands if an inch high. Hence when the lead wires and/or lead tapes are pressed down on top of such gold bumps, the tape, ribbon or wire may sag or otherwise deform in the region where the force is applied and come into contact with parts of the I.C. chip other than the aluminum pad. It is well known in the art that such leads are particularly apt to come into unwanted contact with the edges (e.g., point 25 of FIG. 7) of the I.C. die. Again, any such contact is very detrimental to the clear passage of electrical signals.

Those skilled in the art will also appreciate that in this context, considerable exigencies and problems are associated with making such integrated circuit connections at spacings which often have tolerances well below 1/10 of a thousandth of an inch. Furthermore, these severe tolerances in no way diminish the requirement that such connections be electrically sound and mechanical strong.

Another response to the above noted problems of making certain difficult electrical connections (e.g., a copper wire to an aluminum pad) was the production of tape-automated-bonding (TAB) tapes of the type manufactured by the Minnesota Mining and Manufacturing (3M) Company of Minneapolis, Minn. Typically these tapes are comprised of a thin copper ribbon coated with a gold or a tin coating. Thus, for example the gold coating of the TAB tape bonds more easily melts into a gold bump because no amalgamation is required.

Again, in making such TAB tape/bonding pad connections, two bonding methods have been widely employed. One involves connecting the inner leads with gold bumps previously formed on the bonding pads of the semiconductor element by means of a thermo-compression bond. With the other method, gold bumps, previously formed on the inner leads, are thermo-compression bonded to the bonding pads of the semiconductor element. These two processes are generally depicted in FIGS. 5 and 6.

There are however several drawbacks to these processes. As previously noted, the former requires the previously described, technically difficult, process for forming the gold bumps directly on the semiconductor element. This process is also rather expensive. Therefore, it is not widely used in making conventional integrated circuit chip connections. The latter method does in effect avoid the difficult process of forming the gold bumps directly on the semiconductor element. The gold bumps are pre-formed on the inner leads. In generally, this method of connection is less expensive than the above noted method of placing the gold bump on a chip. However, this method still requires a globule of a very expensive material-gold—for each such connection. Moreover, this process also increases the cost of the TAB tape by addition of a "bumping process" with its own attendant yield losses.

For all of the above noted reasons, the overall success of producing such integrated circuit connections must necessarily include a succession of absolutely necessary operations and each operation must deal with certain spatial, mechanical strength and electrical considerations and implications. For example at least two elements which are to be connected e.g., a lead and a contact pad, must be precisely positioned with respect to each other to very precise dimensions and tolerances. Any unintended contact of the leads implies a loss or garbling of an electrical signal, not just a loss of power. Therefore, any ability to more accurately an successfully make such lead/pad connections represents a very fundamental and valuable advantage.

Those skilled in this art also will appreciate that while the electrical arts have heretofore employed various bonding techniques which do not involve any intermediary bonding material such as gold the hereinafter disclosed processes are different in concept as well as degree. For example, in the past prior art processes, materials have been made to invade, to shallow, but predictable, depths, what would appear to be a solid impermeable mass. One of the most notable and widely used techniques for accomplishing this is in the context of integrated circuits the diffusion of dopants, at high temperatures, from a vapor phase into a solid silicon substrate. The actual diffusion is often promoted by the vibration of the atoms of the solid crystalline lattice. This vibration, in turn, induces microscopic changes in the inter-atomic distances. When this occurs under a cloud of relatively densed packed vapor molecules, especially those which are highly thermally agitated, the surface layers of the crystal will be penetrated and, to some shallow depth, pervaded by atoms of the vapor substance. The amount of such permeation will usually depend upon stearic considerations at the molecular level as well as upon whatever mechanical agitation is used to promote the process. Similarly, those skilled in this art will also appreciate that a clamping two dissimilar materials along a well mated surface for extended periods of time will result in some permeability or mutuality of one material into the other.

In the case of such solid/solid bonding, as it is well known that certain deliberate physical efforts can be applied to promote greater intimacy of interface materials in order to produce maximum conductivity and intercrystalline association and thereby create such bonds without relying upon any foreign material such as gold. These physical efforts usually comprise:

(1) use of heating temperatures up to about 1200° C., (2) use of vibrations, supplied by means of ultrasonic oscillations, at frequencies which depend upon the moment of inertia of the atoms in the crystalline lattice and at amplitudes approximating the interatomic distances of the lattice, and (3) use of direct mechanical pressure, applied normal to the interface of the desired bonds, to promote diffusion.

However, these bonding techniques have not heretofore been applied to the bonding of TAB leads to Aluminum bonding pads in general, and while incorporating a downset in the inner lead in particular. Hence this invention is particularly concerned with accomplishing a direct bonding of certain solids without the use of gold, bumps, especially in the context of making those electrical connections which are particularly associated with the production of integrated circuits devices.

SUMMARY OF THE INVENTION

The herein disclosed processes is capable of making TAB tape/bonding connections without the use of any gold bumps whatsoever and without any significant loss of mechanical strength or electrical conductivity relative to the above noted prior art gold bump techniques. Moreover, the energy and force applications needed to carry out the herein disclosed process can be applied more easily and while better preserving the isolation of contact of the mating pair while avoiding any undesirable contact between the elements undergoing such connection and any other circuit elements, especially the top edges of the integrated circuit die and/or adjacent leads. The herein disclosed process is also particularly well suited to bonding three or more materials (e.g., copper, gold and aluminum) during a single bonding operation.

More particularly this patent disclosure teaches a process by which metal leads, such as the inner leads on tape-automated-bonding (TAB) tape, can be bonded to bonding pads in general, and especially to those aluminum and aluminum alloy bonding pads placed on integrated circuit dies. This invention is also especially concerned with the art of making such connections without unwanted contact between the metal tape lead and any other extraneous portions of the IC die. Fundamentally, the method involves a downset operation applied to a metal lead made by a bonding tool in general, and an ultrasonic bonding tool in particular. Applicant will hereinafter refer to the herein disclosed process as tab-to-pad bonding "TAB-TO-PAD Bonding."

The application of the tab-to-pad bonding process described herein eliminates many of the previously noted objections to the gold bump technology. First and foremost, it eliminates the costs of gold bumps. It also improves the speed of operation, registration, the consistency of intercrystalline diffusion in making TAB tape/bonding pad connections. This, in turn, produces more consistent electrical characteristics in the bond and, in general, serves to produce more successful integrated circuits per wafer than prior art gold bump bonding techniques.

The process also involves certain spatial mechanical operations which serve to improve the overall process. These include juxtaposing the conductor at a precise location for proper registration as close as possible to the center of a conductive contact pad provided on the die for accurate attachment of the conductor to that particular element in that particular location. Preferably the attachment of an integrated circuit by this technique is also aided by heat.

As will be more fully described in the "Description of the Preferred Embodiments" section of this patent disclosure this process revolves around the fact that applicant has discovered that TAB tape can be directly bonded to those bonding pads (e.g., those made of aluminum and aluminum alloys) usually employed to interconnect integrated circuit chips to other elements of an integrated circuit package of an integrated circuit package/while at the same time guaranteeing that the TAB tape will not come into physical or electrical contact with any extraneous and otherwise undesirable portion of the integrated circuit chip. From the spatial point of view, the TAB tape is bent from a height of at least 1.0 thousands of an inch and pressed into contact with the bonding pad while a burst of ultrasonic sound energy is applied to the contacted elements.

The process works best if the lead is bent from a height of between 1 and 7 thousands of an inch. Preferably the head of the bonding tool which forces the lead into contact with the pad will be wider than the width of the TAB tape. Preferably the head of the bonding tool will be from about one and one half to about two times the width of the TAB tape.

Similarly best results are promoted when the TAB tape is wider than it is thick. Preferably the TAB tape will be from about one and one half to about four times wider than it is thick. A typical TAB tape width might be about 2 mils. Again, the width of the head of the bonding tool should be greater than the width of the TAB tape which the head of the bonding tool presses upon.

The force applied by the bonding tool can vary with the materials being employed as well as with the other bonding process parameters. For most applications however, this force will generally vary from about 20 to about 120 grams. For example, in the case of 2 mil wide gold plated TAB tape leads, forces of from about 30 to about 60 grams are preferred.

The ultrasonic energy can also vary with many of the other process parameters. However, applicant has found that ultrasonic amplitudes of from about 20 to about 150 microinches at a frequency of about 40 to 70 kHz, for a period of from about 40 to about 500 milliseconds, are adequate for most bonding operations. Thus for example, in the case of gold covered TAB tape/aluminum bonding pad connection the ultrasonic energy produced by a Hughes Bonder (model 2460), Hughes Aircraft Company, set for a 100 microinch excursion setting, for 100 milliseconds, will produce a very strong and otherwise suitable bond.

In one highly preferred embodiment of the process the ultrasonic energy is applied along the long axis of the TAB tape lead being attached to the pad. When this is done, the resulting relative motion induced between the tape and the pad, produces a rapid longitudinal "wiping" of the two surfaces along this axis. This longitudinal wiping serves to promote a better insinuation of the lattice atoms into the interstices of the juxtaposed surfaces of the materials as they receive the burst of ultrasonic energy.

The overall results of this process also can be somewhat improved if the contact pad is heated (e.g., to temperatures of from about 20° to about 200° C.) prior to the application of the ultrasonic energy. Finally, the resulting bonds can also be better isolated, both electrically and from external mechanical stress, if they are also coated with an insulating material such as an epoxy resin after the bonding operation is completed.

Thus in its more specific terms, this invention involves bonding tape-automated-bonding (TAB) tape to a bonding pad of an integrated circuit die by a process which comprises: (a) aligning a TAB tape lead with a bonding pad; (b) bending the tape lead into physical contact with the bonding pad; and (c) applying ultrasonic energy to vibrate the tape-automated-bonding lead with respect to the bonding pad and thereby bonding the tape lead to the bonding pad. The lead can be made of any metal e.g., copper, gold, silver, etc.) used the integrated circuit manufacturing arts. It is however particularly suited to bonding tape-automated-bonding (TAB) tapes comprised of a copper core surrounded by a gold covering. The process may further comprise surrounding the bonded tape lead and bonding pad with a cover of insulating material such as an epoxy resin material.

Some more specific versions of the process would include: (a) aligning a tape-automated-bonding tape lead having a width greater than its thickness with a bonding pad; (b) heating the bonding pad above ambient temperature; (c) using a bonding tool whose head is wider than the width of the tape-automated-bonding tape lead to bend the tape lead into physical contact with the bonding pad; and (d) applying ultrasonic energy through the bonding tool to vibrate the tape-automated-bonding lead substantially along its longitudinal axis with respect to the bonding pad and thereby bond the tape lead to the bonding pad. Here again, the TAB tape is most preferably comprised of a copper core or ribbon surrounded by a gold covering or a copper core surrounded by a tin covering or coating.

Even more specific parameters of this process would include: (a) aligning a tape-automated-bonding tape lead comprised of a copper core surrounded by a gold coating and having a width at least 1.0 times its thickness with a bonding pad having a width greater than the width of the tape lead and made of materials selected from the group consisting of aluminum and aluminum alloys and aligned such that the tape lead is located from about 1.0 to about 7 thousands of an inch above the bonding pad; (b) heating the bonding pad to about 20° to about 200° Centigrade; (c) using a bonding tool whose head is from about 1.0 to 2 times wider than the width of the tape-automated-bonding tape lead to bend the tape lead downward into physical contact with the bonding pad with a force of from about 20 to about 120 grams; and (d) applying ultrasonic excitation of from about 20 to about 150 microinches at a frequency of about 40 to 70 kHz for a period of from about 10 to about 500 milliseconds through the bonding tool to vibrate the tape-automated-bonding lead substantially along its longitudinal axis with respect to the bonding pad and thereby bonding the tape lead to the bonding tape.

DESCRIPTION OF THE PREFERRED EMBODIMENTS

Figure 1:
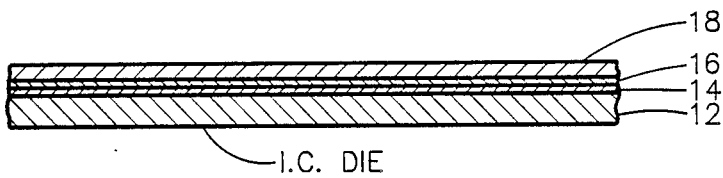
FIGS. 1 to 3 show a prior art method by which a "gold bump" is associated with an integrated circuit (I.C.) die.
Figure 2:
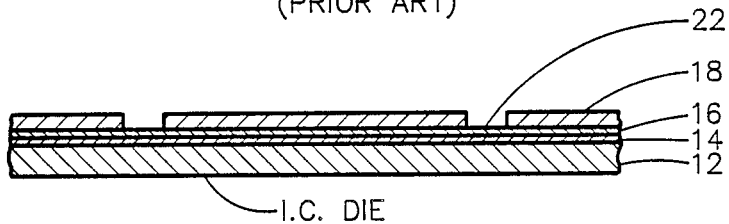
Figure 3:
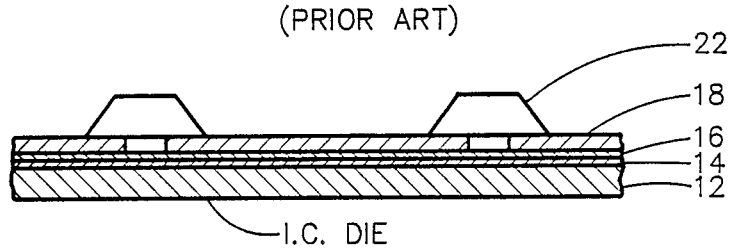
Figure 4:
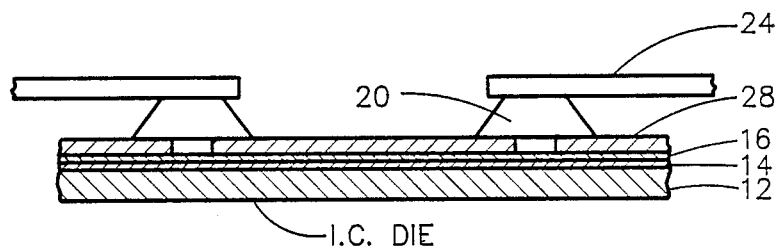
FIG. 4 shows a lead such as a TAB tape attached to a gold bump.
Figure 5:
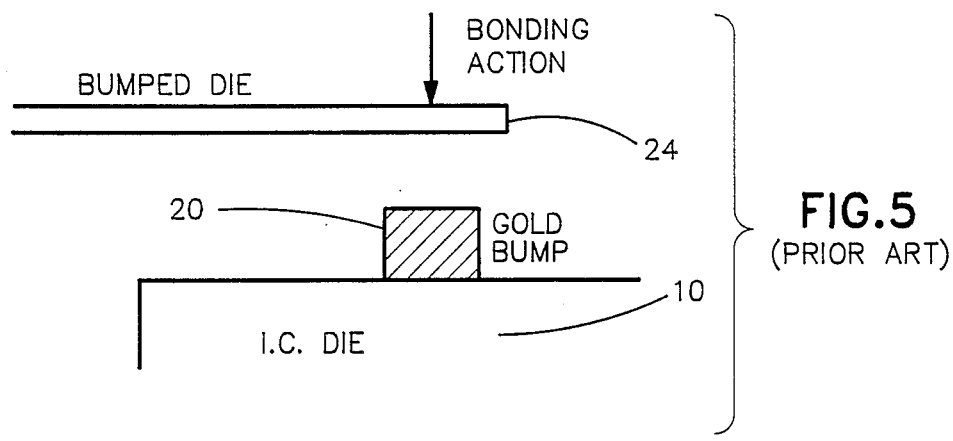
FIG. 5 shows a simplified version of the prior art integrated circuit element of FIG. 4 and the way in by which the lead and gold bump are attached.
Figure 6:
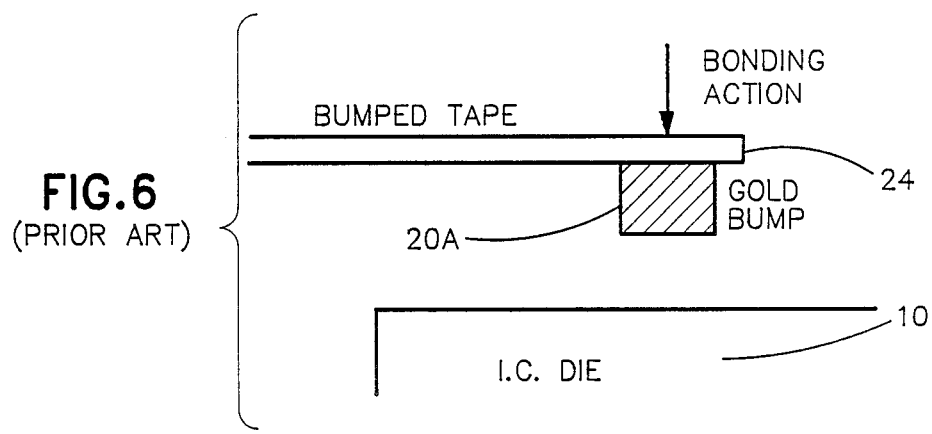
FIG. 6 shows an alternative prior art bonding technique to that shown in FIG. 5 wherein the gold bump is attached to the underside of the lead and forced into contact with the I.C. die.

As previously noted, FIGS. 1 through 4 depict a typical prior art process by which "gold bumps" are placed on integrated circuit chips. FIG. 5 depicts a more simplified rendition of such a prior art integrated circuit (I.C.) die having a gold bump. FIG. 6 contrasts the placement of the gold bump on the lead with the placement upon the I.C. die as shown in FIG. 5. In both cases those skilled in the art will also appreciate that the I.C. dies shown in FIGS. 5 and 6 could also be provided with a bonding pad such as the bonding pad 26 depicted in FIG. 7.

Figure 7:
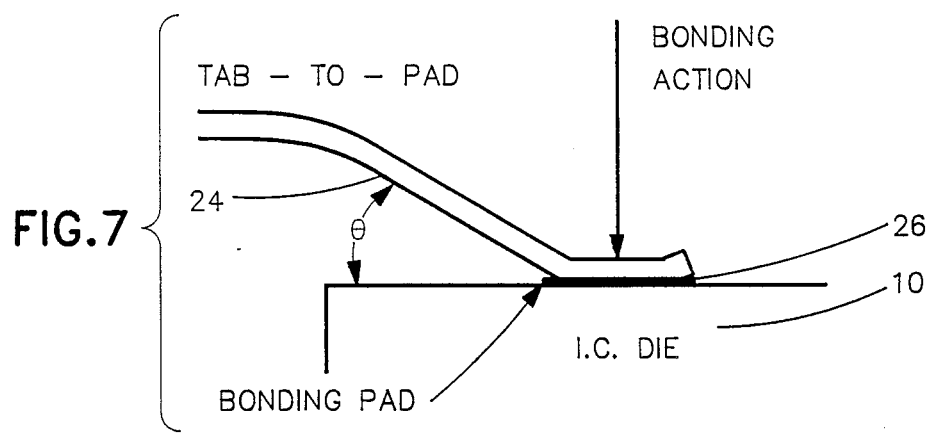
FIG. 7 shows a side view of the results of the process of this patent disclosure wherein the lead is attached to an aluminum pad on an integrated circuit die without the use of a gold bump.

FIG. 7 is intended to contrast the gold bump bonding techniques depicted in FIGS. 5 and 6. FIG. 7 shows how the herein disclosed process allows for bonding a lead 24 to the bonding pad 26 of an integrated circuit die 10. The designation "bonding action" is intended to include the pressure and ultrasonic energy supplied by a bonding tool.

Figure 8:
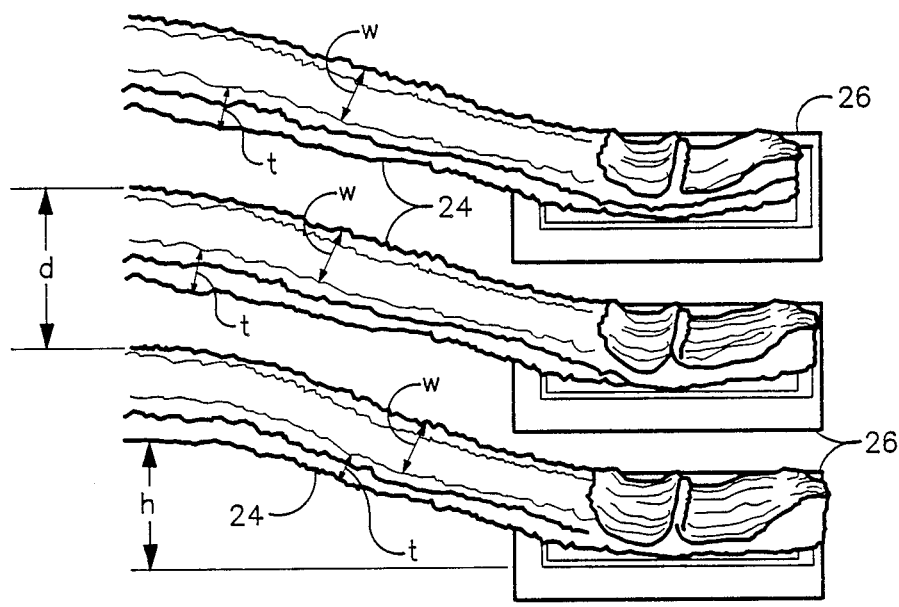
FIG. 8 shows a perspective view of several leads attached to respective aluminum pads by the process of this invention.

FIG. 8 depicts a perspective view of a series of leads 24 attached to their respective bonding pads 26. FIG. 8 is a digitized reproduction of an actual photograph of a series of such connections. Among other things FIG. 8 depicts a preferred embodiment of this invention wherein the relative dimensions play a role in making the ultrasonic bonds of this invention. For example the width w of the lead 24 is shown as being greater than the thickness t of said lead. Although it is not shown, the width w of the head of the bonding tool is preferably greater than the width w of the lead. The height h of the initial level of the lead 24 above pad 26 is preferably from about 1.0 to about 7 and most preferably from about 1.0 to about 4 thousands of an inch. This should be contrasted with the height (item 25 in FIG. 5) of a typical gold bump which usually less than about 1.5 thousand of an inch. Again, Applicant has found that by bending the lead 24 down from such a height increase the angle of the attitude at which the lead 24 addresses the pad 26. This increased angle theta helps insure that the lead 24 will not come into contact with any parts of the I.C. die 10 other than the pad 26.

Finally, those skilled in this art will appreciate that various modifications may be made to the above described process without departing from the scope and spirit of this patent disclosure. By way of example, only, the process could be modified by changing the nature of the materials could change e.g., a copper lead could replace the gold covered and tin covered leads emphasized in this disclosure.

Thus having disclosed my invention, I claim:

1. A process for bonding tape-automated-bonding (TAB) tape to a bonding pad of an integrated circuit die, said process comprising:
   (a) aligning a TAB tape lead with a bonding pad;
   (b) bending the TAB tape lead into physical contact with the bonding pad; and
   (c) applying ultrasonic energy to vibrate the TAB lead with respect to the bonding pad and thereby bond the tape lead to the bonding pad.

2. The process of claim 1 wherein the TAB tape is comprised of a copper core surrounded by a gold covering.

3. The process of claim 1 wherein the bonding pad is made of a material selected from the group consisting of aluminum or an aluminum alloy.

4. The process of claim 1 which further comprises surrounding the bonded tape lead and bonding pad with a cover of insulating material.

5. A process for bonding tape-automated-bonding (TAB) tape to a bonding pad of an integrated circuit die, said process comprising:
   (a) aligning a TAB tape lead having a width greater than its thickness with a bonding pad,
   (b) heating the bonding pad above ambient temperature;
   (c) using a bonding tool whose head is wider than the width of the TAB tape lead to bend the tape lead into physical contact with the bonding pad; and
   (d) applying ultrasonic energy through the bonding tool to vibrate the TAB tape lead substantially along its longitudinal axis with respect to the bonding pad and thereby bond the tape lead to the bonding pad.

6. The process of claim 5 wherein the bonding pad is made of a material selected from the group consisting of aluminum or an aluminum alloy.

7. The process of claim 5 wherein the TAB tape is comprised of a copper core surrounded by a gold covering.

8. The process of claim 5 wherein the TAB tape is comprised of a copper core surrounded by a tin covering.

9. The process of claim 5 which further comprises surrounding the bonded tape lead and bonding pad with a cover of insulating material.

10. A process for bonding a tape-automated-bonding (TAB) tape to a bonding pad of an integrated circuit die, said process comprising:
    (a) aligning a TAB tape lead comprised of a copper core surrounded by a gold coating and having a width at least 1.0 times its thickness with a bonding pad having a bonding pad width greater than the width of the tape lead and wherein such bonding pad is made of materials selected from the group consisting of aluminum and aluminum alloys and wherein the tape lead is located from about 1.0 to about 7 thousands of an inch above the bonding pad;
    (b) heating the bonding pad to about 20° to about 200° Centigrade;
    (c) using a bonding tool whose head is from about 1.0 to 2 times wider than the width of the TAB tape lead to bend the tape lead downward into physical contact with the bonding pad with a force of from about 20 to about 120 grams; and
    (d) applying ultrasonic excitation of from about 20 to about 150 microinches at a frequency of about 40 to 70 kHz for a period of from about 10 to about 500 milliseconds through the bonding tool to vibrate the TAB tape lead substantially along its longitudinal axis with respect to the bonding pad and thereby bond the TAB tape lead to the bonding tape.

11. The process of claim 5 which further comprises surrounding the bonded tape lead and bonding pad with a cover of insulating material.

12. The process of claim 5 wherein the bonding pad is made of a material selected from the group consisting of aluminum or an aluminum alloy.

* * * * *